United States Patent
Ekstein et al.

(10) Patent No.: US 7,816,022 B2
(45) Date of Patent: Oct. 19, 2010

(54) COMPOSITE STRUCTURE FOR MICROLITHOGRAPHY AND OPTICAL ARRANGEMENT

(75) Inventors: Claudia Ekstein, Ellwangen (DE); Hubert Holderer, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/368,027

(22) Filed: Feb. 9, 2009

(65) Prior Publication Data

US 2009/0142615 A1 Jun. 4, 2009

Related U.S. Application Data

(63) Continuation of application No. PCT/EP2007/006963, filed on Aug. 7, 2007.

(30) Foreign Application Priority Data

Aug. 10, 2006 (DE) .................. 10 2006 037 629
Feb. 6, 2007 (DE) .................. 10 2007 005 780

(51) Int. Cl.
B32B 9/00 (2006.01)
B32B 15/00 (2006.01)
(52) U.S. Cl. .............. 428/698; 428/701; 428/702; 428/426; 428/457; 428/469
(58) Field of Classification Search .......... 428/172, 428/304.4, 309.9, 332, 336, 411.1, 426, 429, 428/432, 433, 446, 448, 450, 627, 632, 688, 428/702; 156/60, 89.11, 89.28, 242, 306.6; 501/94, 108, 112, 118–122, 153, 154
See application file for complete search history.

(56) References Cited

U.S. PATENT DOCUMENTS

| 6,134,981 | A | 10/2000 | Novak et al. |
| 6,284,085 | B1 | 9/2001 | Gwo |
| 6,392,824 | B1 * | 5/2002 | Holderer et al. ............ 359/819 |
| 6,426,790 | B1 | 7/2002 | Hayashi |
| 7,572,741 | B2 * | 8/2009 | Das et al. .................... 438/765 |
| 2004/0247826 | A1 * | 12/2004 | Conzone et al. ............. 428/131 |
| 2007/0034305 | A1 * | 2/2007 | Suh .............................. 148/561 |

(Continued)

FOREIGN PATENT DOCUMENTS

GB    2 022 490 A    12/1979

(Continued)

OTHER PUBLICATIONS

David Lide, ed., CRC Handbook of Chemistry and Phyics, 90th Edition, CRC Press/Taylor and Francis, Boca Raton, FL, pp. 12-203 and 4-73.*

(Continued)

*Primary Examiner*—Timothy M Speer
(74) *Attorney, Agent, or Firm*—Sughrue Mion, PLLC

(57) ABSTRACT

A composite structure for microlithography, in particular a holding device for a wafer, has two or more components, the surfaces of which are bonded together at least at one bond. At least one of the components consists of cordierite ($Mg_2Al_4Si_5O_{18}$) or of silicon carbide (SiC). Also disclosed is an optical arrangement, in particular a projection illumination apparatus for microlithography, having at least one such composite structure, preferably a wafer stage.

39 Claims, 2 Drawing Sheets

U.S. PATENT DOCUMENTS

2007/0285647 A1* 12/2007 Kwan et al. .................. 355/72
2008/0305005 A1* 12/2008 Kurokawa et al. ......... 422/68.1

FOREIGN PATENT DOCUMENTS

| | | | |
|---|---|---|---|
| GB | 2022490 A | * | 12/1979 |
| JP | 01-215745 | * | 8/1989 |
| JP | 2003128473 A | * | 5/2003 |
| WO | 01 98225 A1 | | 12/2001 |
| WO | 2006 057408 A1 | | 6/2006 |
| WO | WO 2006057408 | * | 6/2006 |

OTHER PUBLICATIONS

Wallis et al., Field Assisted Glass-Metal Sealing, Journal of Applied Physics, 40 (10), Sep. 1969, pp. 3946-3949.*

Liu et al., Novel approach to form and pattern sol-gel polymethysilsesquixoane-based spin-on glass thin and thick films, Sensors and Actuators B, 88, No month 2003, pp. 75-79.*

DJ Green, Porous Ceramic Processing, Elsevier Science Ltd., Encyclopedia of Materials: Science and Technology, No month 2001, pp. 7758-7762.*

* cited by examiner

US 7,816,022 B2

COMPOSITE STRUCTURE FOR MICROLITHOGRAPHY AND OPTICAL ARRANGEMENT

CROSS-REFERENCE TO RELATED APPLICATIONS

This is a Continuation of International Application PCT/EP2007/006963, with an international filing date of Aug. 7, 2007, which was published under PCT Article 21(2) in English, and the complete disclosure of which, including amendments, is incorporated into this application by reference. This application claims priority under 35 U.S.C. 119(a) to German Patent Application No. 10 2007 005 780.8, filed on Feb. 6, 2007, and to German Patent Application No. 10 2006 037 629.3, filed on Aug. 10, 2006. The entire contents of each of these three applications are hereby incorporated into the present application by reference.

FIELD OF AND BACKGROUND OF THE INVENTION

The invention relates to a composite structure for microlithography, in particular a holding device for a wafer, comprising two or more components, the surfaces of which are bonded together at least at one bond. The invention further relates to a wafer stage and to an optical arrangement, in particular a projection illumination apparatus for microlithography, comprising such a composite structure or such a wafer stage, respectively.

In microlithography, devices (e.g. wafer chuck, wafer stage, wafer table) are required, for example, for holding a wafer, and, although these can be implemented in part as monolithic, they are relatively heavy as a result of the overall sizes required there. Hence, a light-weight structure is frequently desired in such applications, i.e. a structure having cavities for reducing the weight. Such a structure can be implemented as a composite structure which is composed of a plurality of, e.g. ceramic, mineral, glass or glass-ceramic components. In this case, high requirements are imposed on the composite structure and in particular, on the joint, i.e. the bond between the surfaces of the components which are bonded together. The latter should be watertight and long-term stable, i.e. it should exhibit no change in the coefficient of thermal expansion under the action of temperature and in addition, no drift; the same applies to the materials of the components to be bonded together. A composite structure for microlithography is understood in the sense of this application as a composite structure in which the bond satisfies high requirements at the joint even at high beam intensities such as are usual in microlithography. It is understood that the composite structure is also suitable for other systems in which high beam intensities occur, e.g. for laser processing systems which are used, for example, in so-called "annealing" methods.

Various methods for producing composite structures of the type specified initially have been disclosed in the literature. For example, US 2004/0247826 A1 discloses the production of composite structures which are used, for example, in microlithography by joining together at least one glass ceramic component with another component. The composite structures, also designated as light-weight structures, have a fixed bond ("joint") between the surfaces which are joined together, which should withstand a tensile stress of more than 4000 psi and is also temperature-stable. This bond is produced by curing a silicate-containing joining agent at room temperature or under heat treatment with a predefined slow increase in temperature to dehydrate the bond.

The method described there for the bonding of glass ceramics at low temperatures has the advantage over the bonding of glass ceramic parts by fusing on reaching or exceeding the transition temperature of the glass phase (so-called "fusion bonding") that in this case, no deformations can occur as a result of the increase in the viscosity of the glass near the transition temperature. Compared to conventional methods for bonding components at low temperatures, e.g. by means of epoxy resin, the method described there also has the advantage that no organic joining agent is used. When such organic joining agents are used, pyrolysis and/or photolysis of the bond may occur in high-power applications, inter alia, on exposure to laser light in the UV or EUV wavelength range, e.g. at 193 nm, so that this becomes unstable. Another problem is possibly also the matching of the refractive indices of the components as a result of the relatively thick boundary layer between the surfaces.

Known from U.S. Pat. No. 6,284,085 B1 is a method in which two materials are bonded by hydroxide-catalysed hydration/dehydration at room temperature by applying hydroxide ions to at least one of the two surfaces to be joined before the surfaces are brought sufficiently close together that a chemical (covalent) bond is formed between them. For this purpose, the surfaces can be brought sufficiently close together by placing one component on the other. Furthermore, a silicate-containing material can be used as filling material to fill intermediate spaces between the surfaces caused by surface unevennesses, whereby the silicate-containing material can also be in powder form. The hydroxide-catalysed bond should be as strong and reliable as a high-temperature bond and as precise and transparent as an optical contact bond.

In addition to amorphous materials such as quartz glass ("fused silica") and glass ceramics (e.g. Zerodur), crystalline materials, in particular laser crystals such as for example, yttrium aluminum garnet (YAG), may also be mentioned as materials which can be bonded by means of the method described above.

OBJECT OF THE INVENTION

It is one object of the invention to provide a composite structure for microlithography which can be produced simply and cost-effectively and in particular is suitable for lithography applications at high power density.

SUBJECT MATTER OF THE INVENTION

This object is achieved by a composite structure of the type specified initially in which at least one of the components consists of cordierite ($Mg_2Al_4Si_5O_{18}$) or of silicon carbide (SiC).

The inventors have discovered that during the preferred use of the composite structure as a holding device for a wafer, it is not necessary for the materials used to be transparent for radiation at the working wavelength. Components of the aforesaid materials are additionally especially suitable for producing a permanent, i.e., long-term stable bond which can withstand the high radiation intensities usual in microlithography. Furthermore, the aforesaid materials exhibit favorable properties for application in microlithography, these being described in detail below.

Cordierite comprises a magnesium aluminium cyclosilicate which is frequently mixed with iron in its natural mineral occurrence. In the present case, a material having the sum formula (petrographic component notation) $2MgO \times 2Al_2O_3 \times 5 SiO_2$ which can be mixed with up to about 10% of other materials, e.g. the aforementioned iron, is designated as cordierite. In mineral crystalline cordierite, a hexagonal high-temperature modification and an orthorhombic low-temperature modification can be distinguished. The ideal stoichiometric chemistry of cordierite consists of 41.7% $SiO_2$, 35.4% $Al_2O_3$ and 22.9% MgO. In the eutectic the $SiO_2$ content fluctuates around 44.5%±3.0, the $Al_2O_3$ content around 32.2%±1.5 and the MgO content around 23.3%±2.5. These values depend very strongly on the composition of the starting materials and on the cooling process for the mineralisation of the cordierite.

Cordierite is typically used in catalytic converters. The inventors have found that cordierite is particularly well suited for applications in microlithography because it has favorable material properties for this application, i.e. particularly low CTE and high thermal conductivity and can be produced cheaply. A high thermal conductivity is particularly favorable for microlithography applications since the components used there are exposed to high radiation loadings so that these can become heated and at the same time, distorted. Furthermore, cordierite has a relatively low density and is therefore particularly suitable for the production of light-weight structures.

In addition to a high hardness (modulus of elasticity) of about 27 GPa, silicon carbide also has a high wear resistance so that it can be used particularly favorably for the present applications. In addition, silicon carbide has a particularly good thermal conductivity of 180 W/(mK) or more.

The use of such materials in high-precision applications in projection illumination apparatus for microlithography is particularly favorable since the components used there are heated strongly and as a result, a distance once fixed between them can vary, having a negative influence on the imaging quality. In order not to impair the continuous illumination process, e.g. in a projection illumination apparatus, the materials used there must therefore have the lowest possible CTE. Otherwise, if the thermal expansion is too great, there is a risk of the bond breaking which is why the CTE of the bond should substantially match the CTE of the components.

In a preferred embodiment, at least one component, preferably all the components, consist of cordierite. The joining of two or more components of the same material makes it possible to achieve particularly good adhesion of the surfaces to one another.

In a further advantageous embodiment, the cordierite is crystalline and is preferably produced in a sintering process. Unlike vitreous materials, cordierite is thus not obtained via a melt but by using powdery starting materials (granules) under high pressure and at high temperatures below the melting point (at about ⅔ of the melting point). Predominantly used as starting materials are crystoballite (cubic $SiO_2$), corundum ($Al_2O_3$), mullite ($Al_{4+2x}Si_{2-2x}O_{10-x}$ where x is between 0.17 and 0.60, where x is the number of oxygen vacancies per unit cell), as well as protoenstatite ($(Mg, Fe) SiO_3$). The production of cordierite in this way enables it to be obtained particularly cost-effectively and with high purity as a ceramic (polycrystalline) solid. It is understood that other starting materials can also be used, in which case substances which do not contribute to the formation of cordierite can optionally also be used but the fraction thereof should not exceed about 5-10%.

In a preferred embodiment, the cordierite has a density of at least 2.4 g/cm$^3$, preferably at least 2.5 g/cm$^3$ and/or a porosity of 1% or less, preferably of 0.5% or less.

Cordierite having these properties can be obtained, inter alia, by the sintering method described above. The higher the density of the cordierite, the lower its porosity. A barely porous cordierite structure helps to reduce its coefficient of thermal expansion. However, the density should not be selected to be too high and preferably should not exceed 2.6 g/cm$^3$. A medium density in a range between 2.45 g/cm$^3$ and 2.55 g/cm$^3$ has proved to be particularly advantageous.

In a particularly preferred embodiment, the cordierite has a coefficient of thermal expansion of less than $|2.2 \times 10^{-6}|$ 1/K in a range of 20° C. to 300° C. and preferably of at most $|0.5 \times 10^{-7}|$ 1/K in a range of 0° C. to 50° C. Cordierite having such a coefficient of thermal expansion can be obtained by a suitable choice of starting materials and suitable control of the sintering process. Cordierite produced in this way has a barely porous structure and along with this, a coefficient of thermal expansion which substantially corresponds to the afore-mentioned materials.

In a further particularly advantageous embodiment, the cordierite has a thermal conductivity of at least 4.3 W/(mK) which can also be obtained by a suitable choice of starting materials and process parameters of the sintering process.

In a further advantageous embodiment, at least one of the components consists of silicon carbide, wherein a layer of silicon carbide (SiC) is preferably deposited on its surface and the surface is activated with oxygen and/or sputtered with silicon dioxide ($SiO_2$). The deposition of a surface layer of silicon carbide, e.g. by "chemical vapour deposition" (CVD) makes it possible to produce a particularly smooth and hard surface. Additionally or alternatively to the deposition of the surface layer, the SiC surface can also be enriched with oxygen (by way of plasma treatment, oxidizing etc.) and/or sputtered with silicon dioxide ($SiO_2$) so that a better adhesive strength is achieved; an oxygen($O_2$)-enriched SiC surface offers better binding possibilities for covalent Si—O—; Si—OH; Si—Si— bonds. The preferred thickness of the SiC layers is at least 500 nm in this case.

In a further advantageous embodiment, at least one of the components consists of a barely porous ceramic, a glass or a glass ceramic having a coefficient of thermal expansion of at most $|0.5 \times 10^{-7}|$ 1/K in a range of 0° C. to 50° C., the glass or the glass ceramic preferably being selected from the group consisting of Zerodur, Clearceram and ULE. It is understood that in addition to silicon carbide and cordierite, other materials can also be used in the composite structure, e.g. the aforesaid glasses or glass ceramics or the materials referred to in the documents cited above.

The glass ceramic materials having the low coefficients of thermal expansion (CTE) specified above usually consist of a crystalline phase and a glass phase. In this case, the crystalline phase has a negative coefficient of expansion which can be exactly compensated by the positive coefficient of expansion of the glass phase. Glass materials having such a low CTE usually comprise doped glasses, for example, $TiO_2$ doped quartz glass. The barely porous ceramic having the given CTE can, for example, comprise cordierite. "Barely porous" is understood in the sense of the present application to mean that the porosity is less than 1%, preferably less than 0.5%.

In a particularly advantageous embodiment, the bond is produced by an inorganic joining agent cured at a temperature of less than 600° C., preferably less than 150° C. The inventors have found that cordierite is particularly advantageously suited for a joining method using such an inorganic joining agent. The curing preferably takes place at room temperature or by heating to a temperature of up to 600° C., preferably up to 150° C. If the joined components are heated to dehydration, this preferably takes place at slow heating rates in a furnace. The curing time depends on the size of the joined area and can be in the range of one or more days up to about 2 to 4 weeks.

After curing, the composite structure can be processed mechanically (polishing, grinding, thinning down).

The joining method can also be carried out as described in US 2004/0247826 A1 and U.S. Pat. No. 6,284,085 B1, which in their entirety are incorporated into this application by reference. In particular, solutions of OH-containing and/or silicate-containing substances can be used as inorganic joining agents. These substances contained in the joining agent are usually dissolved in water. The chemical bond between the surfaces is formed by hydration and subsequent dehydration or by the formation of a silicate network between the surfaces so that composite structures having the required properties, in particular as regards the durability and quality of the joint, can be produced.

In a preferred further development, the joining agent contains at least one substance selected from the group consisting of alkali hydroxides, alkaline earth hydroxides and ammonium hydroxide ($NH_4OH$). These substances are preferred suppliers of hydroxide ions and can have a catalytic effect on the formation of the bond as is described in detail in U.S. Pat. No. 6,284,085 B1 mentioned initially. Naturally the suppliers of hydroxide ions and optionally other substances not specified there can be used.

In a further advantageous further development, the joining agent contains at least one substance selected from the group consisting of alkali silicates, alkaline earth silicates, silicic acid, polysilicic acids, halogen-containing silicic acid and halogen-containing polysilicic acids. These substances are preferred suppliers of silicate ions, where in addition to silicic acid, its polymerised derivatives ((poly-) silicic acids) can also be used. Naturally, other suppliers of silicate ions can also be used such as those specified, for example, in the documents mentioned initially.

In a further preferred embodiment respectively one first metallic layer is applied to the surfaces and the bond is made by pressing the components. A bond can also be made by pressing which is consistent with the high requirements in microlithography. It is understood that the production of a bond between two components by direct pressing, i.e. without using an inorganic joining agent, can only be carried out alternatively to the type of bonding described above. In a composite structure however, a plurality of components can be present which are bonded at different locations in different ways so that a plurality of differently produced bonds can be implemented in various ways in one and the same structure.

In a preferred further development of this embodiment, the first metallic layer has a maximum melting point of 700° C. and a maximum modulus of elasticity of 100 GPa, preferably a maximum of 70 GPa. This is therefore a readily fusible soft metal, preferably aluminium (Al), indium (In), zinc (Zn) and tin (Sn). The layer thickness of the first metal layer is preferably less than 1 μm.

In a preferred further development, a second metallic layer is applied to the first metallic layer as oxidation protection for the first metallic layer and/or as alloy hardening. The second metallic layer typically has a maximum layer thickness of 100 nm. The second layer acts as alloy hardening when the lattice form/lattice structure of the second metal is matched to the lattice form/lattice structure of the first metal, i.e. comparable lattice spacings and lattice lengths are present. In this case, the two metals can diffuse into one another so that alloy hardening occurs.

In a particular advantageous further development, the second metallic layer is formed of a non-oxidisable metal, preferably a precious metal, in particular silver (Ag) or gold (Au). These metals do not oxidise in air and therefore protect the first layer from oxidation. The preferred layer thickness of the second layer should be 200 nm or less.

In a further preferred further development, the first and/or the second metallic layer is applied in a vacuum process, preferably by PVD. The metals used in this case should be selected to be suitable for vacuum.

In another advantageous further development, the components are pressed at a pressure of more than 1 bar, preferably of more than 2 bar and at a temperature of less than 250° C. For this purpose, the components usually metallised in a vacuum coating system are placed one upon the other and brought into a bonder, where the metallised surfaces bond together, the melting point of the metals not generally being exceeded. The temperature is usually slowly increased during this process and reduced again.

In a further embodiment, respectively one metal layer is applied to the surfaces, the thickness thereof preferably being at least 100 nm, particularly preferably at least 200 nm wherein the bond is produced by soldering the components. In this case, the metallised surfaces are not pressed directly but are bonded together by fusing a solder.

In a preferred further development of this embodiment, the metal layer is formed from a metal which is selected from the group consisting of chromium (Cr), gold (Au), nickel (Ni) and titanium (Ti). These metals are particular suitable as adhesion promoters between the substrate and the solder.

In another preferred further development the solder has a maximum melting point of 400° C., preferably a maximum of 200° C. so that the surfaces of the components are not heated too severely during bonding. For example, InSn 5248 (melting point 120° C.), AuSn 8020 (melting point 280° C.), BiSn 5842 (melting point 140° C.), as well as InAg 9703 (melting point 150° C.) can be used as solders.

In a preferred further development, the metal layer and/or the solder is applied in a vacuum process, preferably by way of PVD. In this case, the metal layer can be applied in a first vacuum process and the solder in a subsequent vacuum process.

In a further embodiment, the bond is formed by a glass frit, preferably in the form of a film or a preform or by a glass paste or glass solder paste. In this case, it is not necessary to metallise the surface. In this case, the CTE of the glass frit and the glass or glass solder paste is matched to the CTE of the components to be bonded and is preferably less than 7 ppm. The layer thickness of said substances, in particular the glass frit or the glass preform is typically less than 70 μm.

In an advantageous further development the glass frit or the glass paste or glass solder paste have a maximum sealing temperature of 350° C. For bonding the components are placed in a bonder for bonding under pressure and temperature, where the joining process substantially takes place as in direct pressing. However, for bonding the components in certain cases it is also sufficient merely to subject these to temperature treatment in a furnace and typically for about 10-30 h.

In a further embodiment the bond is formed by an adhesive which preferably has a maximum TOC value of 250 ng/mg. TOC is understood as the so-called total organic contamination which gives the fraction of organic compounds outgassed from a material. The TOC value given above is characteristic of an adhesive in which only small quantities of hydrocarbons are released.

The adhesive is preferably a two-component adhesive whose modulus of elasticity is preferably at least 3000 $N/mm^2$. The volume slippage of the adhesive should be less than 4.5%, the possible usage temperature range should be between −40° C. and +130° C. Adhesives with and without fillers can be used, preferably an epoxy-resin-based adhesive being used to which an amine curing agent is added.

In a further preferred embodiment, the bond is produced by anodic bonding, wherein preferably applied to at least one surface is a layer which releases ions, preferably alkali ions. During anodic bonding the components to be bonded, placed one above the other, are brought to different potentials, typically with a voltage difference of around 1 kV or above. At the same time, the components are heated to temperatures of 400° C. or less. At this voltage and temperature the alkali ions are released from the layer or optionally from the components and migrate towards the cathode whilst at the same time $O^{2-}$ ions migrate towards the anode and form permanent Si—O—Si bonds at the contacting surfaces to be bonded.

In another advantageous embodiment, the bond is produced by spin-on-glass, spin-on-dielectric or by a sol-gel process. Spin-on-glass (SOG) is a generic term for a series of chemicals which are used in the semiconductor industry for producing silicate glass layers on ICs. An SOG precursor usually consists of silicon, oxygen and hydrogen as well as optionally other constituents. Spin-on-dielectric (SOD) is likewise a generic term whereby substantially the following substances are understood by this term: silicates, in particular nanopore silicates, siloxanes and organic polymers. In a sol-gel process, solid particles having diameters of a few hundred nanometers, typically tetraethoxysilane, tetramethyl orthosilicate, sodium silicate or glycoester are dissolved in a solvent, whereby a plurality of hydrolysis and polymerisation reactions take place with the formation of a colloidal solution, the particles subsequently condensing to form a gel.

In a particularly advantageous embodiment, the bond has an adhesive strength of more than 10 $N/mm^2$, preferably of more than 20 $N/mm^2$. Such an adhesive guarantees the stability of the composite structure, it being ensured in particular that this can also be processed mechanically after the bonding. Such a high adhesive strength can be achieved, for example, by polishing the surfaces before joining to a surface quality of less than $\lambda$.

In another embodiment, the composite structure has at least one, in particular closed, cavity. Such a preferably closed cavity helps to reduce the weight and cannot be achieved with a monolithic structure since cavities must be produced in such a structure, e.g. by drilling and therefore are necessarily not closed from the surroundings.

In a further preferred embodiment the composite structure comprises a first plate and a second plate between which are located a plurality of supporting elements forming a ribbed structure. A light-weight structure is thereby formed, which can preferably be configured as a holding structure of a wafer, in particular as a wafer chuck or wafer stage. A wafer chuck holds the wafer firmly for transport through negative pressure or electrostatic forces, a wafer stage is used for storage of the wafer during an illumination process in a projection illumination apparatus. The design described above can also be used as a preform for mirrors, however, further embodiments of this design being specified in US 2004/0247826 A1 cited initially.

In a further preferred embodiment the surfaces are polished before bonding to a surface quality of less than $\lambda$, preferably less than $\lambda/2$ at $\lambda=632$ nm. The surface quality is measured in this case as the "peak-to-valley" value. The surfaces of the two components to be joined together must be cleaned and particle-free before joining; the joining can be carried out, for example, in a clean room. The preceding surface treatment has an influence on the adhesive strength of the parts to be joined. Polished surfaces are optimal but lapped and untreated surfaces also adhere to one another. The quality of the bond can be checked after the bonding by using a suitable test method, preferably by computer tomography. Possible voids, inclusions, defects etc. in the joining seam can thus be identified and defective composite structures can be separated out if necessary or the composite structures can be classified into quality classes. Ideally, the joining seam between the components can no longer be detected by computer tomography.

In a further advantageous embodiment, the composite structure is configured as a wafer stage. In this case, preferably at least one cavity is formed between at least two components, which cavity is preferably configured to receive heating elements, built-in components or as a cooling channel. As a result of the configuration of the wafer stage as a composite structure, cavities can easily be provided therein without the wafer stage needing to be processed mechanically. A wafer stage usually has a base body and a supporting structure for a wafer (wafer table) attached thereon, wherein preferably at least one cavity is formed in the base body. It is furthermore preferred if the components of the base body consist of cordierite and/or one of the glasses or glass ceramics specified above. The components of the supporting structure preferably consist of silicon carbide and can be coated as described above, for example, by applying a layer of silicon carbide by way of CVD to at least one of the surfaces.

The invention is also implemented in a wafer stage comprising one of the materials selected from the group consisting of cordierite ($Mg_2Al_4Si_5O_{18}$) and silicon carbide (SiC). In this case, the wafer stage may comprise only one material, e.g. being formed as a monolithic block of cordierite or silicon carbide, advantageously using the favorable properties of those materials for application in microlithography. Preferably, the wafer stage comprises two or more components comprising one of these materials, the surfaces of these components being bonded together at least at one bond in the way described above with respect to the composite structure.

The invention is also implemented in an optical arrangement, in particular a projection illumination apparatus for microlithography, comprising at least one composite structure as described above, preferably a wafer stage which is configured as described above. Such a projection illumination apparatus comprises an illumination system for homogeneous illumination of an object plane in which a mask having a mask structure to be imaged is located. This mask structure located in the object plane is imaged by a subsequently positioned projection objective onto a light-sensitive surface of a wafer in a reduced scale.

Further features and advantages of the invention are obtained from the following description of exemplary embodiments of the invention with reference to the drawings which show details important for the invention and from the claims. The individual features can each be implemented individually or in a plurality in any combination in one variant of the invention.

BRIEF DESCRIPTION OF THE DRAWINGS

Exemplary embodiments are shown in the schematic drawings and are explained in the following description. In the figures.

DETAILED DESCRIPTION OF THE PREFERRED EMBODIMENTS

Figure 1A:
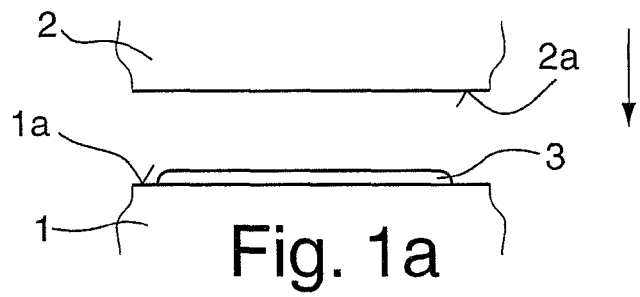
FIGS. 1a, b is a schematic diagram of a cordierite component on the surface whereof a joining agent is applied and which is bonded to a second component (a) of cordierite and (b) of silicon carbide.

FIG. 1a is a schematic diagram of a first ceramic component 1 consisting of (poly)crystalline cordierite which has been produced in a sintering process, whereby this was obtained with high purity and therefore consists of a fraction higher than 98% of $Mg_2Al_4Si_5O_{18}$. Alternatively, naturally occurring mineral cordierite could also be used. A joining agent 3 is applied to a surface 1a of the cordierite component 1 to be joined, said joining agent 3 comprising an aqueous solution of polymerised silicic acid which was formed from monosilicic acid ($H_4SiO_4$). In this case, the polymerised silicic acid is mixed with at least one halogen. A chemical bond between the cordierite and another suitable material can be formed by the silicate-containing substance. Naturally, in addition to silicic acid and its derivatives, other silicate ($SiO_4^{4-}$) suppliers can also be used, e.g. alkali silicates and/or alkali earth silicates or other silicate-containing substances such as are described, for example, in US 2004/0247826 A1 or U.S. Pat. No. 6,284,085 B1, in particular also $SiO_2$.

For producing a bond, a second component 2 is applied to the component 1 as indicated by the arrow in FIG. 1a, whereby a second surface 2a of the second component 2 which is to be bonded to the first surface 1a, is located opposite to one another. In this case, the second component 2 is also made of cordierite. By using two components 1, 2 which both consist of the same material, a particularly firm bond can be achieved.

Figure 1B:
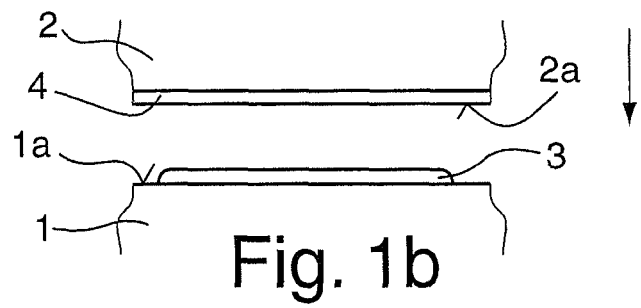

Alternatively, the first component 1 can also be bonded to a second component 2 made of a different suitable material. In this case, silicon carbide (SiC) is particularly suitable as the material for the second component. It is particularly advantageous for the strength of the bond in this case if the surface 2a to be joined is formed on a layer 4 of silicon carbide, as shown in FIG. 1b in which case the layer 4 was applied by deposition in the vapour phase, e.g. by chemical vapor deposition (CVD) on the silicon carbide component 2. The layer 4 can, for example by oxidation, be additionally enriched with oxygen or sputtered with $SiO_2$ to improve the adhesive strength. A supplier of $OH^-$ ions is used as the joining agent 3 and is preferably an alkali hydroxide, an alkaline earth hydroxide or ammonium hydroxide ($NH_4OH$). Other suitable substances for this purpose are specified, for example, in U.S. Pat. No. 6,284,085 B1. As a result of the joining agent 3 used, a hydroxide-catalyzed hydration of the components 1, 2 is achieved at least in the near-surface region, by which a chemical bond can be formed between the surfaces 1a, 2a. Silicate-containing and hydroxide-containing substances can also be used jointly in the same joining agent 3. In addition, a filler can also be incorporated in the joining agent such as, for example, pulverized quartz glass ($SiO_2$).

Figure 2:
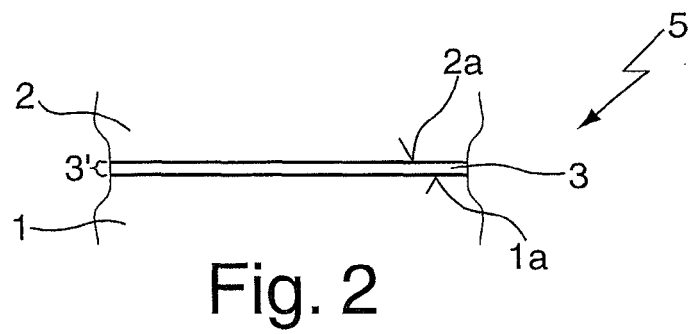
FIG. 2 is a schematic diagram of an embodiment of a composite structure which was formed by bringing together the components from FIG. 1a, FIGS. 3a, b (a) schematic diagram of two components of cordierite each having one first and one second metallic layer and (b) a composite structure produced therefrom.

By bringing together the components 1, 2 as shown in FIG. 1a and FIG. 1b, a bond 3', also called joint or joining seam, is formed between their surfaces 1a, 2a, which is filled by the joining agent 3, cf. FIG. 2. In order to obtain a stable bond 3', this is usually cured in air. This can take place at room temperature (about 20° C.), alternatively the bonded components 1, 2 can also be heated in a furnace to temperatures of up to 150° C. so that the water present in the joining agent 3 can evaporate more rapidly. During the temperature treatment, care should be taken to ensure that the increase in temperature is made slowly since, otherwise, the bond 3 could be damaged. After the curing, which can take a time between about 2 to 4 weeks depending on the size of the surface of the joint, a firm, permanent bond 3 is formed between the components 1, 2, and thus a composite structure 5.

Alternatively to the production of the composite structure 5 described above using an inorganic joining agent 3, this can also be replaced by a low-outgassing adhesive, typically a two-component adhesive. In this case, as described above, the adhesive can be applied to the surface 1a of the first component 1 to be joined and the components 1, 2 then brought together.

Likewise, alternatively to the two methods described above, instead of the inorganic joining agent or the adhesive, a glass frit, preferably in the form of a film or a preform, or a glass paste or glass solder paste can be used. These are applied as shown in FIG. 1 and for forming the bond, the components 1, 2 are then heated in a bonder (not shown) to a maximum temperature of 350° C. (sealing temperature) and exposed to an overpressure. When a glass frit is used, the thickness of the applied layer is usually less than 70 µm. The CTE value of the glass paste, glass solder paste or the glass frit is matched to the CTE value of the components 1, 2 to be joined and is usually below 7 ppm.

Figure 3A:
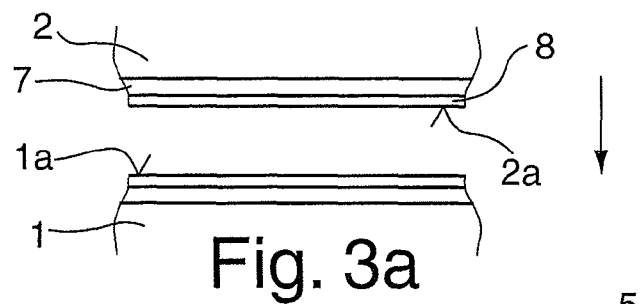

Another possibility for producing the composite structure 5 is shown in FIG. 3a. Applied to the two cordierite components 1, 2 is respectively one first metallic layer 7 made of aluminium having a layer thickness of less than 1 µm to which a second metallic layer 8 made of a precious metal, in the present case of gold, having a layer thickness of less than 200 nm is applied as protection from oxidation. In addition to aluminium, other soft metals having a maximum melting point of 700° C. can also be used as the first metallic layer 7, in particular indium, zinc or tin. Particularly suited as the second metallic layer 8 is a metal having a similar lattice structure to the metal of the first metallic layer 7, so that the metals can diffuse into one another, resulting in alloy hardening. The two metallic layers 7, 8 are applied to the components 1, 2 in a vacuum process by way of PVD, which is why the metals used must be suitable for vacuum.

Figure 3B:
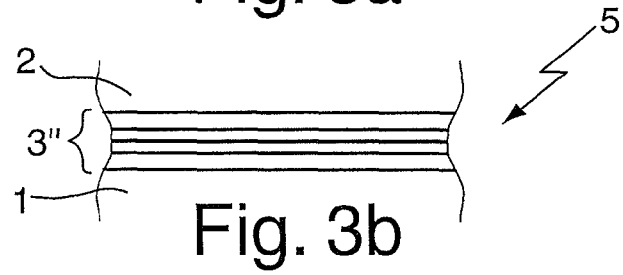

FIG. 3b shows the composite structure 5 which was obtained by pressing the two components from FIG. 3a at a pressure of over 2 bar and a temperature of less that 250° C. at slow heating rates by forming a firm bond 3" between the components 1, 2 in a bonder.

Figure 4:
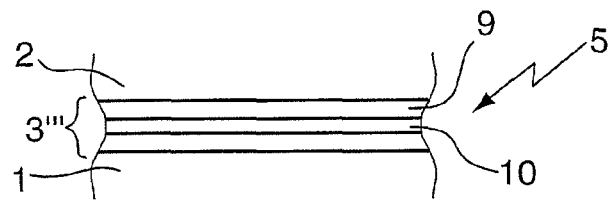
FIG. 4 is a schematic diagram of a composite structure comprising two components bonded to one another by a solder.

FIG. 4 shows a composite structure in which, as in FIGS. 3a, b, a metal layer 9 is applied to the components 1, 2. In this case, however, the bond 3''' is not formed by pressing but by fusion of a solder 10. The solder 10 has a melting point of less than 400° C. so that the components 1, 2 must not be heated too strongly for the bonding. Preferably used as material for the metal layer 9 which serves as an adhesion promoter between the components 1, 2 and the solder 10 are chromium, gold, nickel or titanium, the layer thickness usually being above 100 nm. In this case, the solder 10, like the metal layer 9, is applied in a vacuum process.

In addition to the methods for producing a bond between the components which have been described above, other methods also exist, for example, so-called anodic bonding for which component 1 can be prepared by applying an alkali-ion-releasing layer to said component. In addition, the bond can also be produced by substances designated as spin-on-glass or spin-on-dielectric or by a sol-gel process.

The strength of the bond 3', 3", 3''' of the composite structure 5 depends on various factors. In particular, if the surfaces 1a, 2a of the components 1, 2 are polished before bonding to a surface quality of less than λ, preferably less than λ/2 at a wavelength of 632 nm (peak-to-valley), a bond 3 capable of withstanding a tensile stress of more than 10 N/mm$^2$, optionally of more than 20 N/mm$^2$ without rupture can be produced. The bond 3', 3", 3''' can be inspected using computer tomography whereby defects etc. can be detected and their quality can be examined without the need to subject these to a stress test which could permanently damage the bond 3', 3''', 3''''.

If cordierite components 1, 2 are exclusively used, a CTE of less than |0.5×10$^{-7}$| 1/K in a range between 0° C. and 50° C. and |2.2×10$^{-6}$| 1/K in a range between 20° C. and 300° C. can be achieved for the composite structure 5. An average density between 2.4 g/cm$^3$ and 2.6 g/cm$^3$ and a thermal conductivity of about 4.3 W/(mK) or higher can also be achieved with such a composite structure 5. In this case, the cordierite used can have a porosity of less than 1%, optionally less than 0.5%.

When components 1, 2 made of cordierite or of silicon carbide are used for the composite structure 5, no optical components can be achieved with these since they are not transparent for the radiation used. However, these materials can be combined with other transparent components to form a composite structure which can then serve as an optical component.

For this purpose, ceramic, mineral, glass or glass ceramic materials, e.g. ULE glass, Clearceram or Zerodur, depending on the desired material properties, can be bonded to component 1 made of cordierite or silicon carbide or amongst one another in one of the ways described above. The materials described above have a very low coefficient of thermal expansion of at most |0.5×10$^{-7}$| 1/K in a range of 0° C. to 50° C. and can therefore advantageously be used in applications in which a precise alignment of components 1, 2 with respect to one another is important, also under high exposure to radiation.

It is understood that more than two components 1, 2 can be joined together through one or more of the methods described above to form a composite structure 5. In this case, one or several of these joining methods can be applied several times in succession for joining two or more components.

As a result of its properties which have been described above, the composite structure can be used particularly preferably in microlithography, for example, as a holding device for a wafer, and specifically as a wafer chuck or wafer stage. The former is generally used for holding the wafer, for example, through negative pressure or electrostatic forces, for example, when the wafer is to be moved by using a gripper arm. The latter is used in a projection illumination apparatus for microlithography during the illumination process as a bearing surface for the wafer.

Figure 5:
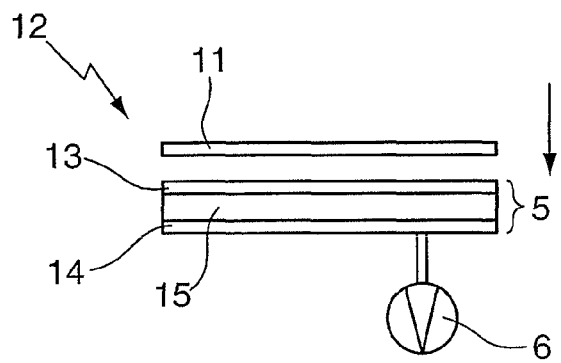
FIG. 5 is a schematic diagram of a composite structure which is configured as a wafer chuck and of a vacuum source for producing a negative pressure.

Shown schematically in FIG. 5 is such a holding device configured as a wafer chuck 12. In the highly simplified representation in FIG. 5, this merely consists of the composite structure 5 on which a wafer 11 is to be held firmly and a vacuum pump 6. The vacuum pump 6 produces a vacuum between the wafer 11 and the composite structure 5 which sucks the wafer 11 towards the composite structure 5 as indicated by the arrow in FIG. 5. In this case, the composite structure 5 comprises a first upper plate 13 and a second lower plate 14 which are matched in shape and size. Located between the plates 13, 14 is a plurality of supporting elements which form a ribbed structure 15 (mesh) having a honeycomb-shaped structure, running perpendicular to the plates 13, 14. Vacuum suction can be effected through the honey-combs of the mesh 15 and openings provided in the plates 13, 14. Furthermore, as a result of the honeycomb-like structure, the composite structure 5 is particularly light and can, for example, have less than about 30% of the weight which would result from using a solid cordierite component as the wafer chuck 12. The composite structure 5 can also be part of a wafer chuck which operates through electrostatic attraction and in which a high-voltage source is provided to produce an electric field between the composite structure 5 and the wafer 11. Such a wafer chuck is also suitable for vacuum applications.

Figure 6:
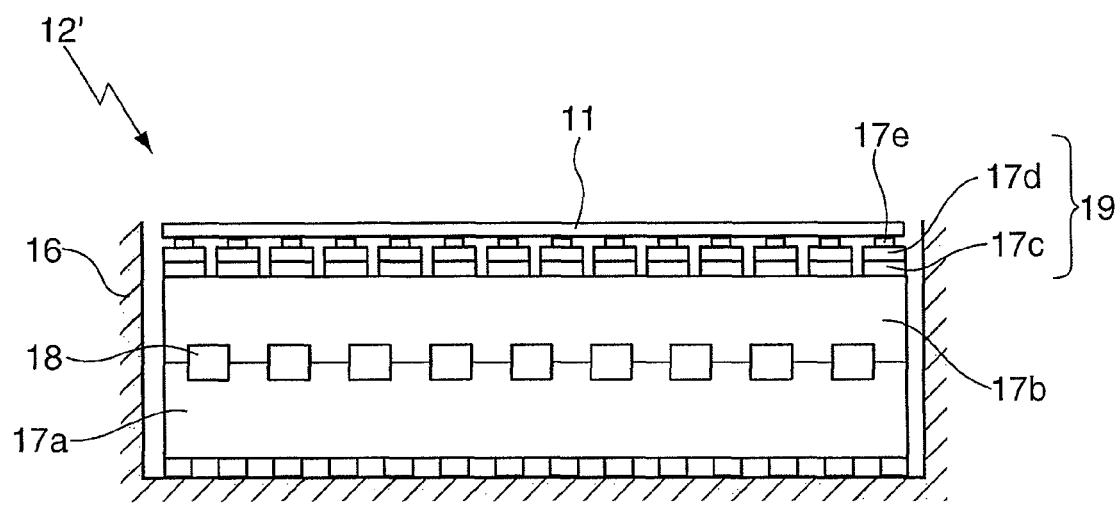
FIG. 6 is a schematic diagram of a wafer stage as a composite structure comprising a plurality of components which are bonded together.

Finally, FIG. 6 shows a wafer stage 12' which is used for mounting the wafer 11 during the illumination process in a projection illumination apparatus (not shown) for microlithography. The wafer stage 12' is recessed in a receptacle 16 which is configured in such a manner that its upper edge ends flush with the wafer 11. The wafer stage consists of a first lower component 17a made of cordierite which is bonded to a second upper component 17b made of cordierite by soldering, both jointly forming the base body ("bulk") of the wafer stage 12'. Alternatively, the two components 17a, 17b can also be made of other materials, preferably of Zerodur.

The two components 17a, 17b of the base body have recesses located opposite to one another, forming a plurality of cavities 18 between the components 17a, 17b. The cavities 18 serve as cooling channels for removing heat which occurs more intensively as a result of the absorption of radiation in the components 17a, 17b at high beam intensities in microlithography. It is understood that further cavities, e.g. for receiving built-in components or heating elements, can also be provided in the wafer stage 12' and that these can also be provided with mesh structures, for example, as described above to achieve an additional reduction in weight.

A plurality of supporting structures 19 ("pimples") mounted at the same distance from one another are disposed on the upper component 17b of the wafer stage 12' to support the wafer 11. These structures each comprise a lower component 17c made of cordierite which is bonded to an upper component 17d of CVD-coated silicon carbide likewise by soldering.

A further component 17e of CVD-coated silicon carbide is also applied to the two components 17c, 17d forming a base body of the supporting structure 19, said component having a reduced diameter for the spot mounting of the wafer 11. In this case, the upper component 17d and the further component 17e of the supporting structure 19 form a monolithic unit. Alternatively, the upper component 17d can be bonded to the further component 17e by one of the types of bonding described above. It is understood that the components 17c-e of the supporting structure 19 can consist entirely of silicon carbide.

The wafer stage 12' thus formed can withstand the high beam intensities in microlithography, whereby a light-weight structure is achieved through the type of selected components and at the same time, good heat transfer and a low thermal expansion are ensured and the high adhesive strength of the bonds guarantees a high mechanical stability. It is also possible to form the wafer stage 12' not as a composite structure but as a monolithic block of cordierite or silicon carbide. Also in this case, the favorable properties of these materials for application in microlithography can be advantageously used.

The person skilled in the art will recognize that the composite structure described above can be used not only as a holding device for a wafer but generally for components in optical arrangements, in particular lithography optics.

Naturally, the area of application of such a composite structure is not restricted to lithography optics; rather, this structure can also be used in other areas, for example, in x-ray telescopy or in laser processing systems.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A composite structure for microlithography, comprising a first component having a first coefficient of thermal expansion, and a second component having a second coefficient of thermal expansion, each component having a surface, the surfaces being bonded together by at least one bond, wherein the first component comprises cordierite, and the second component comprises silicon carbide.

2. The composite structure according to claim 1, wherein the second coefficient of thermal expansion is substantially similar to a coefficient of thermal expansion of a wafer; and
    wherein the first coefficient of thermal expansion is substantially smaller than the second coefficient of thermal expansion.

3. The composite structure according to claim 2, wherein the cordierite has a thermal conductivity of at least 4.3 W/mK.

4. The composite structure according to claim 1, wherein the cordierite is crystalline.

5. The composite structure according to claim 1, wherein the cordierite has at least one of: a density of at least 2.4 g/cm$^3$ and a porosity of at most 1%.

6. The composite structure according to claim 1, wherein the cordierite has a coefficient of thermal expansion of less than $|2.2\times10^{-6}|$1/K in a range of 20° C. to 300° C.

7. The composite structure according to claim 1, wherein a layer of silicon carbide (SiC) is deposited on a surface of the second component, and wherein the surface is at least one of: activated with oxygen and sputtered with silicon dioxide (SiO$_2$).

8. The composite structure according to claim 1, further comprising a further component consisting of a glass or a glass ceramic having a coefficient of thermal expansion of at most $|0.5\times10^{-7}|$1/K in a range of 0° C. to 50° C.

9. The composite structure according to claim 1, wherein the bond is produced by an inorganic joining agent cured at a temperature of less than 600° C.

10. The composite structure according to claim 9, wherein the joining agent contains at least one substance selected from the group consisting of alkali hydroxides, alkaline earth hydroxides and ammonium hydroxide (NH$_4$OH).

11. The composite structure according to claim 9, wherein the joining agent contains at least one substance selected from the group consisting of alkali silicates, alkaline earth silicates, silicic acid, polysilicic acids, halogen-containing silicic acid and halogen-containing polysilicic acids.

12. The composite structure according to claim 1, wherein respectively one first metallic layer is applied to the surfaces, and the bond is produced by pressing the components.

13. The composite structure according to claim 12, wherein the first metallic layer has a maximum melting point of 700° C. and a maximum modulus of elasticity of 100 GPa.

14. The composite structure according to claim 12, wherein the first metallic layer is formed by a metal selected from the group consisting of aluminium (Al), indium (In), zinc (Zn) and tin (Sn).

15. The composite structure according to claim 12, wherein a second metallic layer is applied to the first metallic layer.

16. The composite structure according to claim 15, wherein the second metallic layer is formed of a non-oxidizable metal.

17. The composite structure according to claim 12, wherein the first metallic layer is applied in a vacuum process.

18. The composite structure according to claim 12, wherein the components are pressed at a pressure of more than 1 bar and at a temperature of less than 250° C.

19. The composite structure according to claim 1, wherein respectively one metal layer is applied to the surfaces, and the bond is produced by soldering the components.

20. The composite structure according to claim 19, wherein the metal layer is formed from a metal which is selected from the group consisting of chromium (Cr), gold (Au), nickel (Ni) and titanium (Ti).

21. The composite structure according to claim 19, wherein the solder has a maximum melting point of 400° C.

22. The composite structure according to claim 19, wherein at least one of the metal layer and the solder is applied in a vacuum process.

23. The composite structure according to claim 1, wherein the bond is formed by a glass frit or by a glass paste or glass solder paste.

24. The composite structure according to claim 23, wherein the glass frit or the glass paste or the glass solder paste has a maximum sealing temperature of 350° C.

25. The composite structure according to claim 1, wherein the bond is formed by an adhesive.

26. The composite structure according to claim 25, wherein the adhesive is a two-component adhesive.

27. The composite structure according to claim 1, wherein the bond is produced by anodic bonding.

28. The composite structure according to claim 1, wherein the bond is produced by a spin-on-glass process, by a spin-on-dielectric process, or by a sol-gel process.

29. The composite structure according to claim 1, wherein the bond has an adhesive strength of more than 10 N/mm$^2$.

30. The composite structure according to claim 1, further comprising at least one closed cavity.

31. The composite structure according to claim 1, wherein the components form a first plate and a second plate between which are located a plurality of supporting elements forming a ribbed structure.

32. The composite structure according to claim 1, wherein the surfaces are polished before bonding to a surface quality of less than $\lambda=632$ nm.

33. The composite structure according to claim 1, which is configured as a wafer stage.

34. The composite structure according to claim 33, wherein at least one cavity is formed between the at least two components.

35. The composite structure according to claim 33, wherein the components are comprised in a base body and a supporting structure for a wafer.

36. The composite structure according to claim 1, which is configured as a holding device for a wafer.

37. The composite structure according to claim 1, which is configured as a wafer chuck.

38. The composite structure according to claim 1, which is configured as a wafer table.

39. The composite structure according to claim 1, wherein the first component is comprised in a base body, and the second component is comprised in a wafer supporting structure.

* * * * *

UNITED STATES PATENT AND TRADEMARK OFFICE
CERTIFICATE OF CORRECTION

PATENT NO. : 7,816,022 B2  Page 1 of 1
APPLICATION NO. : 12/368027
DATED : October 19, 2010
INVENTOR(S) : Claudia Ekstein and Hubert Holderer It is certified that error appears in the above-identified patent and that said Letters Patent is hereby corrected as shown below:

Title Page, Item [56]
First Page Col. 2 (Other Publications) Line 1: Delete "Phyics," and insert -- Physics, --

Page 2 Col. 2 (Other Publications) Line 4: Delete "polymethysilsesquixoane" and insert -- polymethylsilsesquioxane --

Column 10, Line 51: Delete "that" and insert -- than --

Column 11, Line 15: Delete "3', 3''', 3'''." and insert -- 3', 3'', 3'''. --

Signed and Sealed this
Twelfth Day of April, 2011

David J. Kappos
*Director of the United States Patent and Trademark Office*